US011924996B2

(12) United States Patent
Zakaib et al.

(10) Patent No.: US 11,924,996 B2
(45) Date of Patent: Mar. 5, 2024

(54) LIQUID-COOLING DEVICES, AND SYSTEMS, TO COOL MULTI-CHIP MODULES

(71) Applicant: CoolIT Systems, Inc., Calgary (CA)

(72) Inventors: Brad Zakaib, Calgary (CA); Kamal Mostafavi, Calgary (CA); Jarod Domingo, Calgary (CA); Yixuan Gao, Calgary (CA)

(*) Notice: Subject to any disclaimer, the term of this patent is extended or adjusted under 35 U.S.C. 154(b) by 0 days.

(21) Appl. No.: 17/201,394

(22) Filed: Mar. 15, 2021

(65) Prior Publication Data

US 2022/0104395 A1 Mar. 31, 2022

Related U.S. Application Data

(60) Provisional application No. 63/085,882, filed on Sep. 30, 2020.

(51) Int. Cl.
*H05K 7/20* (2006.01)

(52) U.S. Cl.
CPC ..... *H05K 7/20254* (2013.01); *H05K 7/20272* (2013.01); *H05K 7/20409* (2013.01)

(58) Field of Classification Search
CPC . F28D 1/05391; H01L 23/473; H01L 23/367; H01L 23/3672; H05K 7/20927; H05K 7/20254; H05K 7/20263; H05K 7/20272; H05K 7/20409; H05K 7/20781; H05K 7/20772; H05K 7/2079; H05K 7/20763; H05K 7/20627; H05K 7/20636;

(Continued)

(56) References Cited

U.S. PATENT DOCUMENTS

| 3,524,497 A | 8/1970 | Chu et al. |
| 4,183,402 A * | 1/1980 | Cotter .................. F28D 1/0316 165/DIG. 473 |

(Continued)

FOREIGN PATENT DOCUMENTS

| CN | 101715283 | 5/2010 |
| CN | 102469748 | 5/2012 |

(Continued)

OTHER PUBLICATIONS

International Search Report and Written Opinion for PCT Application No. PCT/IB2021/058860, dated Dec. 15, 2021, 6 pages.

(Continued)

*Primary Examiner* — Adam B Dravininkas
(74) *Attorney, Agent, or Firm* — WORKMAN NYDEGGER

(57) ABSTRACT

A heat exchanger for a liquid cooling system has an enclosure defining an internal chamber and a wall defining an external major surface of the enclosure. The enclosure extends from a first open end to an opposed second open end and an inlet passage extends from the first open end to the internal chamber. An outlet passage extends from the internal chamber to the second open end. A plurality of corrugated fins are conductively coupled with the wall defining the external major surface and positioned in the internal chamber. A liquid cooling system can include such a heat exchanger. And, an electronic device can include one or more multichip modules cooled by such a cooling system.

46 Claims, 6 Drawing Sheets

(58) Field of Classification Search
CPC ........... H05K 7/20645; H05K 7/20654; H05K 7/20218; H05K 1/0203
See application file for complete search history.

(56) References Cited

U.S. PATENT DOCUMENTS

| | | | |
|---|---|---|---|
| 4,621,687 A * | 11/1986 | Ikuta | F28F 1/128 |
| | | | 165/152 |
| 5,307,870 A * | 5/1994 | Kamiya | F28F 9/182 |
| | | | 165/173 |
| 5,457,885 A * | 10/1995 | Ohashi | F28F 9/001 |
| | | | 29/890.044 |
| 5,966,287 A | 10/1999 | Lofland et al. | |
| 6,421,240 B1 | 7/2002 | Patel | |
| 6,496,375 B2 | 12/2002 | Patel et al. | |
| 6,655,449 B1 | 12/2003 | Hsien | |
| 6,667,882 B2 | 12/2003 | Pauser | |
| 6,807,056 B2 | 10/2004 | Kondo et al. | |
| 6,853,554 B2 | 2/2005 | Bash et al. | |
| 7,068,507 B2 | 9/2006 | Pfeifer et al. | |
| D531,965 S | 11/2006 | Stathakis | |
| 7,151,668 B1 | 12/2006 | Stathakis | |
| 7,209,355 B2 | 4/2007 | Koga et al. | |
| 7,271,969 B2 | 9/2007 | Carpenter et al. | |
| D553,170 S | 10/2007 | Remsburg et al. | |
| 7,286,355 B2 | 10/2007 | Cheon | |
| 7,312,987 B1 | 12/2007 | Konshak | |
| D561,711 S | 2/2008 | Lin | |
| D573,110 S | 7/2008 | Otsuki et al. | |
| 7,420,808 B2 | 9/2008 | Campbell et al. | |
| 7,626,820 B1 | 12/2009 | Konshak et al. | |
| 7,757,506 B2 | 7/2010 | Ellsworth, Jr. et al. | |
| 7,855,888 B2 | 12/2010 | Peterson | |
| 7,907,398 B2 | 3/2011 | Hrehor, Jr. et al. | |
| 7,933,125 B2 | 4/2011 | Wei et al. | |
| 7,957,134 B2 | 6/2011 | Farnsworth et al. | |
| 7,965,509 B2 | 6/2011 | Campbell et al. | |
| 7,969,736 B1 | 6/2011 | Iyengar et al. | |
| 7,978,472 B2 | 7/2011 | Campbell et al. | |
| 8,004,841 B2 | 8/2011 | Cipolla et al. | |
| 8,027,162 B2 | 9/2011 | Campbell et al. | |
| 8,066,057 B2 | 11/2011 | Olesen | |
| 8,081,473 B2 | 12/2011 | Cipolla et al. | |
| 8,125,780 B2 | 2/2012 | Goth et al. | |
| 8,238,101 B2 | 8/2012 | Kalms et al. | |
| 8,385,067 B2 | 2/2013 | Arvelo et al. | |
| 8,385,069 B2 | 2/2013 | Iyengar et al. | |
| 8,493,738 B2 | 7/2013 | Chainer et al. | |
| 8,542,488 B2 | 9/2013 | Peterson et al. | |
| 8,570,744 B2 | 10/2013 | Rau et al. | |
| 8,587,943 B2 | 11/2013 | Barina et al. | |
| 8,599,557 B2 | 12/2013 | Peterson et al. | |
| 8,638,559 B2 | 1/2014 | Barina et al. | |
| 8,649,177 B2 | 2/2014 | Chainer et al. | |
| 8,659,897 B2 | 2/2014 | Meijer et al. | |
| D715,747 S | 10/2014 | Imoto | |
| D715,750 S | 10/2014 | Mira et al. | |
| 8,913,384 B2 | 12/2014 | David et al. | |
| 9,158,348 B2 | 10/2015 | Berk et al. | |
| D755,741 S | 5/2016 | Prajuckamol et al. | |
| D772,823 S | 11/2016 | Lindeman | |
| D773,408 S | 12/2016 | Lindeman | |
| D774,473 S | 12/2016 | Lindeman | |
| D800,674 S | 10/2017 | Schaltz et al. | |
| 9,816,762 B2 * | 11/2017 | Sugimoto | F28F 3/025 |
| 9,867,315 B2 | 9/2018 | Berk et al. | |
| 2002/0002853 A1 * | 1/2002 | Gerard | F28F 3/027 |
| | | | 72/335 |
| 2002/0007935 A1 * | 1/2002 | Marsala | F25B 39/022 |
| | | | 257/E23.098 |
| 2003/0164233 A1 * | 9/2003 | Wu | F28F 3/12 |
| | | | 165/166 |
| 2004/0182544 A1 | 9/2004 | Lee et al. | |
| 2005/0109493 A1 * | 5/2005 | Wu | F02B 29/0462 |
| | | | 165/157 |
| 2005/0117298 A1 | 6/2005 | Koga | |
| 2005/0121173 A1 * | 6/2005 | Inagaki | F28F 9/0236 |
| | | | 257/E23.098 |
| 2005/0247444 A1 * | 11/2005 | Ohata | F28D 1/05391 |
| | | | 165/177 |
| 2006/0007720 A1 | 1/2006 | Pfeifer et al. | |
| 2006/0098409 A1 * | 5/2006 | Cheon | G11B 33/142 |
| | | | 361/699 |
| 2006/0250772 A1 | 11/2006 | Salmonson et al. | |
| 2006/0291165 A1 * | 12/2006 | Flesch | H01L 23/473 |
| | | | 257/E23.098 |
| 2008/0007915 A1 | 1/2008 | Chen | |
| 2008/0084664 A1 | 4/2008 | Campbell et al. | |
| 2008/0264613 A1 | 10/2008 | Chu | |
| 2009/0002951 A1 | 1/2009 | Legen et al. | |
| 2009/0044929 A1 | 2/2009 | Yeh et al. | |
| 2009/0080151 A1 | 3/2009 | Kalms et al. | |
| 2009/0190303 A1 | 7/2009 | Chu et al. | |
| 2009/0268409 A1 | 10/2009 | Zhou et al. | |
| 2009/0277616 A1 | 11/2009 | Cipolla et al. | |
| 2009/0284924 A1 | 11/2009 | Konshak et al. | |
| 2009/0323286 A1 | 12/2009 | Han | |
| 2010/0000655 A1 * | 1/2010 | Ni | H01L 23/4093 |
| | | | 156/60 |
| 2010/0025010 A1 | 2/2010 | Cipolla et al. | |
| 2010/0085712 A1 | 4/2010 | Hrehor, Jr. et al. | |
| 2010/0091447 A1 | 4/2010 | Jaggers et al. | |
| 2010/0175852 A1 | 7/2010 | Peterson | |
| 2010/0252234 A1 | 10/2010 | Campbell et al. | |
| 2011/0069454 A1 | 3/2011 | Campbell et al. | |
| 2011/0304979 A1 | 12/2011 | Peterson et al. | |
| 2012/0020004 A1 | 1/2012 | Rau et al. | |
| 2012/0020022 A1 | 1/2012 | Peterson et al. | |
| 2012/0026692 A1 | 2/2012 | Loong et al. | |
| 2012/0152500 A1 | 6/2012 | Kao et al. | |
| 2012/0199334 A1 * | 8/2012 | Maurer | F28F 1/122 |
| | | | 165/185 |
| 2012/0261095 A1 | 10/2012 | Wu | |
| 2013/0027870 A1 | 1/2013 | Goldrian et al. | |
| 2013/0120926 A1 | 5/2013 | Barina et al. | |
| 2013/0135812 A1 | 5/2013 | Barina et al. | |
| 2013/0194745 A1 | 8/2013 | Meijer et al. | |
| 2013/0342987 A1 | 12/2013 | Yang et al. | |
| 2014/0069614 A1 | 3/2014 | Chiu | |
| 2015/0212555 A1 | 7/2015 | Cox et al. | |
| 2016/0026223 A1 | 1/2016 | Berk et al. | |
| 2016/0118317 A1 | 4/2016 | Shedd et al. | |
| 2016/0234968 A1 | 8/2016 | Huang | |
| 2016/0327996 A1 | 11/2016 | Sasabe et al. | |
| 2016/0363967 A1 | 12/2016 | Tsai | |
| 2016/0366788 A1 | 12/2016 | Liao et al. | |
| 2018/0084672 A1 | 3/2018 | Berk et al. | |
| 2019/0249939 A1 | 8/2019 | Otsuki | |

FOREIGN PATENT DOCUMENTS

| | | |
|---|---|---|
| CN | 102782837 | 11/2012 |
| CN | 102419623 | 3/2014 |
| DE | 102007045733 | 2/2009 |
| WO | 2011053311 | 5/2011 |
| WO | 2016187131 | 11/2016 |

OTHER PUBLICATIONS

ASHREA Technical Committee 9.9, "Water-Cooled Servers Common Designs, Components, and Processes," The White Paper, Oct. 10, 2019, 50 pages. ASHRAE, Atlanta, GA.

Niles International, "Expanded Metal Stair Treads," Niles, Sep. 15, 2020, (https://nilesexpandedmetals.com/expanded-metal/?gclid=Cj0KCQiAmKiQBhCIARIsAKtSj-k7rlbUIU2a_Aib2ygTWLudFfFEYYQCawJWg76yEjqjt1qYQKEQfs4aAp3DEALw_wcB) last accessed Feb. 14, 2022, 1 page.

* cited by examiner

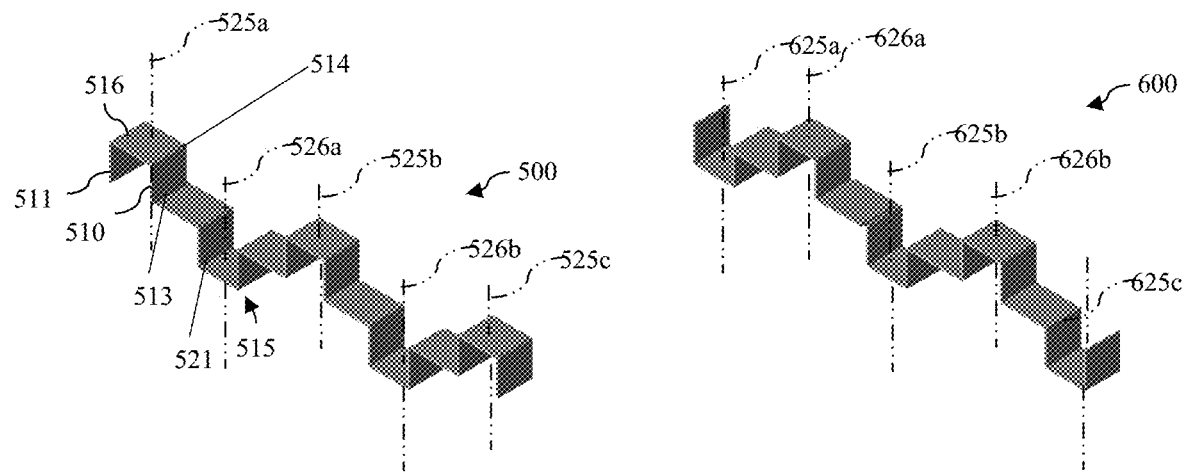
FIG. 9
FIG. 10
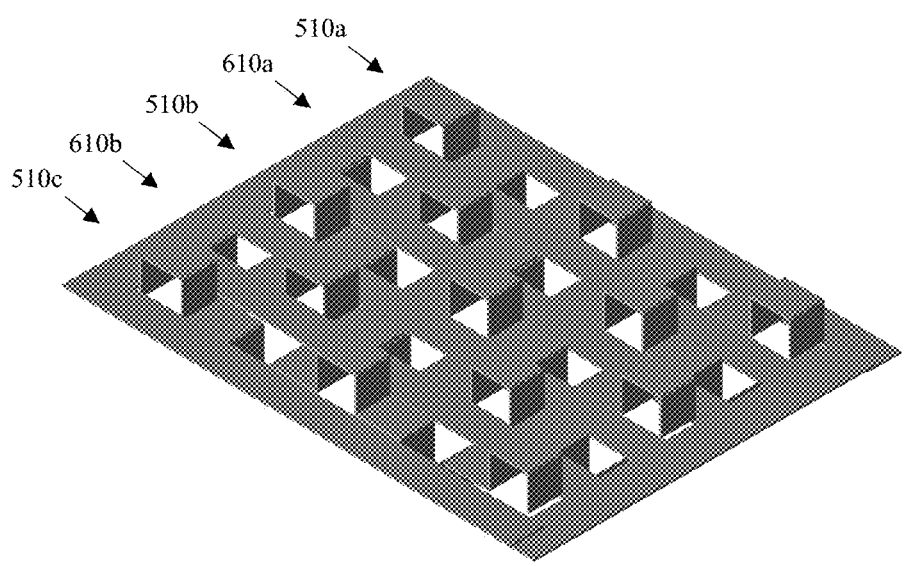
FIG. 11

LIQUID-COOLING DEVICES, AND SYSTEMS, TO COOL MULTI-CHIP MODULES

FIELD

This application and the subject matter disclosed herein (collectively referred to as the "disclosure"), generally concern liquid-cooling devices, and related systems and methods. More particularly, but not exclusively, this disclosure pertains to systems, methods, and devices suited to cool multi-chip modules, such as, for example, memory modules having a plurality of individual memory components mounted to one or both sides of a substrate. For example, such a substrate can include a printed circuit board, which may be generally planar or may have a plurality of component mounting surfaces at a corresponding plurality of elevations from a reference plane.

BACKGROUND INFORMATION

New generations of electronic components, such as, for example, memory components, microprocessors, graphics processors, and power electronics semiconductor devices, produce increasing amounts of heat during their operation. If the heat is not removed at a sufficient rate, the components can overheat, decreasing performance, reliability, or both, and in some cases component damage or failure.

SUMMARY

Presently disclosed cooling devices and systems provide improved thermal performance for multi-chip modules compared to previously proposed cooling systems. As but one illustrative example, a liquid-cooled cold plate can thermally couple with a plurality of DRAM components mounted to a dual inline memory module, sometimes referred to in the art as a DIMM, to enhance cooling of the DRAM components by transferring heat to a liquid passing through the cold plate.

Electronic devices, such as, for example, servers, computers, game consoles, power electronics, communications and other networking devices, batteries, and so on, can use air cooling, liquid cooling (e.g., involving one- or two-phases with say, water or refrigerant, respectively), or both, to transfer and dissipate heat from electronic components to an ultimate heat sink, e.g., the atmosphere. Conventional air cooling relies on natural convection or uses forced convection (e.g., a fan mounted near a heat producing component) to replace heated air with cooler ambient air around the component. Such air-cooling techniques can be supplemented with a conventional "heat sink," which often is a plate of a thermally conductive material (e.g., aluminum or copper) placed in thermal contact with the heat-producing component. The heat sink can spread heat from the component to a larger area for dissipating heat to the surrounding air. Some heat sinks include "fins" to further increase the surface area available for heat transfer and thereby to improve the transfer of heat to the air. Some heat sinks include a fan to force air among the fins and are commonly referred to in the art as "active" heat sinks.

Liquid cooling improves cooling performance compared to air cooling techniques described above, as many liquids, e.g. water, have significantly better heat transfer capabilities than air. FIG. 1 illustrates various components of a liquid cooling loop 100. The cooling loop 100 typically operates by (1) transferring heat, $\dot{Q}_{in}$, from a heat-generating electronic component (not shown) to a cool liquid passing through a heat exchanger 110 (sometimes referred to in the art as a "cold plate" or a "heat sink") placed in thermal contact with the heat-generating component, (2) transporting the heat absorbed by the liquid to a remote radiator 120, or heat rejector (sometimes referred to in the art generally as a "heat exchanger," or a "liquid-to-liquid heat exchanger" if the heat is rejected to another liquid or a "liquid-to-air heat exchanger" if the heat is rejected to air), (3) dissipating the heat, $\dot{Q}_{out}$, from the remote radiator to another medium (e.g., air or facility water passing through the remote radiator), and (4) returning cooled liquid to the heat exchanger (or heat sink).

According to a first aspect, a heat exchanger for a liquid cooling system has an enclosure defining an internal chamber and a wall defining an external major surface of the enclosure. The enclosure extends from a first open end to an opposed second open end and an inlet passage extends from the first open end to the internal chamber. An outlet passage extends from the internal chamber to the second open end. A plurality of corrugated fins are conductively coupled with the wall defining the external major surface and positioned in the internal chamber.

The enclosure can include a first shell member and a second shell member sealably affixed to each other. The first shell member can define the wall defining the external major surface and a corresponding outer periphery. The first shell member can include a peripheral flange oriented transversely relative to the external major surface and positioned adjacent the outer periphery of the external major surface. The peripheral flange can be sealably affixed with the second shell member.

The second shell member can define a corresponding outer periphery and a peripheral flange extending around the outer periphery of the second shell member. The peripheral flange extending around the outer periphery of the second shell member can be sealably affixed with the peripheral flange of the first shell member.

The wall defining the external major surface can be a first wall and the first shell member can include the first wall. The second shell member can include a second wall, and the plurality of corrugated fins can be positioned between the first wall and the second wall. The plurality of corrugated fins being further conductively can be coupled with the second wall.

The external major surface can be a first external major surface, and the second wall can define a corresponding second external major surface.

Each of the first shell member and the second shell member can define a corresponding peripheral flange, and a brazed joint can sealably affix the respective peripheral flanges together.

The plurality of corrugated fins can urge against the wall that defines the external major surface of the enclosure, conductively coupling the fins with the wall.

The plurality of corrugated fins can be conductively affixed to the wall. For example, the plurality of corrugated fins can be soldered or brazed to the wall, conductively affixing the fins to the wall.

The plurality of corrugated fins can be arranged in a plurality of rows of corrugated fins, each row of corrugated fins being defined by an undulating and continuous sheet of material.

Each row of corrugated fins can define a corresponding longitudinal axis along which each respective row of corrugated fins extends. Each corrugated fin can define a corresponding corrugation axis, and each corrugation axis of each corrugated fin in each respective row can be oriented transversely to the longitudinal axis of the respective row.

In at least one row of corrugated fins, each corrugation axis of a first plurality of fins can extend in a first transverse direction relative to the corresponding longitudinal axis and each corrugation axis of a second plurality of fins can extend in a second transverse direction relative to the corresponding longitudinal axis. The first transverse direction and the second transverse direction can be opposite each other.

The longitudinal axis of the at least one row of corrugated fins can extend parallel to the longitudinal axis of at least one other row of corrugated fins.

The first transverse direction and the second transverse direction can be opposite of each other relative to a plane defined by the parallel longitudinal axes. The first plurality of fins and the second plurality of fins can be juxtaposed with each other. A corresponding segment of the continuous sheet of material can extend from each corrugated fin in the first plurality of fins to an adjacent corrugated fin in the second plurality of fins.

Each corrugation axis corresponding to a first row of corrugated fins can be longitudinally offset relative to each corrugation axis corresponding to a second row of corrugated fins.

Each corrugation axis corresponding to the first row can extend in a first transverse direction and each corrugation axis corresponding to the second row can extend in a second transverse direction. The first transverse direction and the second transverse direction can be opposite each other.

A segment of the continuous sheet of material can extend from each row of corrugated fins to an adjacent row of corrugated fins.

Each corrugated fin in a plurality of fins in at least one of the rows of fins can define a fin segment oriented substantially parallel to the corresponding longitudinal axis. Each fin segment can urge against the wall defining the external major surface of the enclosure.

Each fin segment can be conductively affixed to the wall defining the external major surface of the enclosure.

The enclosure can define an outer peripheral surface extending from the first open end to the opposed second open end. A region of the peripheral surface can be sufficiently flat as to be configured as an intended heat-transfer surface. As discussed more fully below, the flat region of the peripheral surface can thermally couple with a retainer or other device in a manner as to receive heat.

According to another aspect, a heat exchanger for a liquid cooling system includes an inlet manifold and an outlet manifold. The heat exchanger also includes a cold plate including an enclosure that defines a first external major surface, an opposed second external major surface, and a corresponding internal chamber positioned between the first external major surface and the second external major surface. The internal chamber is fluidically coupled with the inlet manifold and the outlet manifold.

In some embodiments, the cold plate further includes an array of corrugated fins defined by a continuous sheet of material. The array of corrugated fins is positioned within the internal chamber and conductively coupled with the enclosure.

The enclosure can include a first shell member defining a corresponding periphery. The first external major surface and a second shell member can define a corresponding periphery and the second external major surface. The periphery of the first shell member and the periphery of the second shell member can be sealably joined together.

The cold plate can extend from a first open end fluidicly coupled with the inlet manifold to an opposed second open end fluidicly coupled with the outlet manifold.

The enclosure can define a fluid inlet passage extending from the first open end to the internal chamber and a fluid outlet passage can extend from the internal chamber to the second open end.

The array of corrugated fins can be positioned between the first open end of the cold plate and the second open end of the cold plate. The cold plate can be a first cold plate, and the heat exchanger can further include a second cold plate that defines a corresponding internal chamber fluidically coupled with the inlet manifold and the outlet manifold.

The first cold plate can be fluidically coupled with the inlet manifold and the outlet manifold in parallel with the second cold plate.

According to yet another aspect, a cooling system for an electronic device includes a distribution manifold and a collection manifold, and a plurality of cold plates. Each cold plate includes an enclosure that defines a first external major surface, an opposed second external major surface, and a corresponding internal chamber positioned between the first external major surface and the second external major surface. Each respective internal chamber is fluidicly coupled with the distribution manifold and the collection manifold The cooling system also includes a heat exchanger configured to transfer heat from a liquid coolant passing through the heat exchanger to another medium. A pump is configured to urge the liquid coolant through and among the distribution manifold, the plurality of cold plates, the collection manifold and the heat exchanger.

At least one of the cold plates can further include an array of corrugated fins defined by a continuous sheet of material. The array of corrugated fins is positioned within the internal chamber and conductively coupled with the enclosure corresponding to the respective at least one of the cold plates.

Each enclosure can include a first shell member that defines a corresponding periphery and the respective first external major surface. Each enclosure can further define a second shell member that defines a corresponding periphery and the respective second external major surface. The periphery of each respective first shell member can be sealably joined with the periphery of the corresponding second shell member.

Each cold plate can extend from a first open end fluidicly coupled with the distribution manifold to an opposed second open end fluidicly coupled with the collection manifold.

Each respective enclosure can define a fluid inlet passage extending from the corresponding first open end to the corresponding internal chamber and a fluid outlet passage extending from the corresponding internal chamber to the corresponding second open end.

Each array of corrugated fins can be positioned between the first open end of the corresponding cold plate and the second open end of the corresponding cold plate.

Each cold plate can be fluidically coupled with the distribution manifold and the collection manifold in parallel with at least one other cold plate.

According to yet another aspect, an electronic device includes a multi-chip module having mounted thereto a plurality of active electronic components. Each active electronic component dissipates heat while operating. The electronic device also includes a cold plate that includes an external major surface positioned opposite the plurality of active components, an internal chamber. The electronic device also includes a thermal interface between the external major surface of the cold plate and each in the plurality of active components. A retainer is configured to urge the external major surface of the cold plate and the plurality of active components of the multi-chip module toward each other.

The cold plate can include an array of corrugated fins defined by a continuous sheet of material positioned in the internal chamber.

The multi-chip module can have a first side and an opposed second side. The plurality of active electronic components can be a first plurality of active electronic components mounted to the first side of the multi-chip module, the cold plate can be a first cold plate, and the thermal interface can be a first thermal interface. The electronic device can further include a second plurality of active electronic components mounted to the second side of the multi-chip module. The retainer can define a region positioned opposite the second plurality of active electronic components. And, a second thermal interface can be positioned between the second plurality of active electronic components and the opposed region of the retainer. The retainer can be thermally conductive and further configured to urge the second plurality of active electronic components and the opposed region of the retainer toward each other.

The cold plate can define an outer peripheral surface extending from the first open end to the opposed second open end. A region of the peripheral surface can be sufficiently flat as to be configured as an intended heat-transfer surface. The flat region of the peripheral surface can thermally couple with the retainer, providing a conductive heat-transfer path, through the retainer, from the second plurality of electronic components to the cold plate.

The multi-chip module can be a first multi-chip module and the external major surface of the cold plate can be a first external major surface. The cold plate can further define a second external major surface positioned opposite the first external major surface, and the electronic device can further include a second multi-chip module having a first side with a corresponding plurality of active electronic components positioned opposite the second external major surface of the cold plate. A third thermal interface can be positioned between the plurality of active electronic components of the second multi-chip module and the second external major surface of the cold plate. The retainer can be further configured to urge the plurality of active electronic components corresponding to the first side of the second multi-chip module and the second external major surface of the cold plate toward each other.

The second multi-chip module can have a second side with a corresponding plurality of active electronic components. The second side of the second multi-chip module can be positioned opposite the first side of the second multi-chip module. The region of the retainer positioned opposite the second plurality of active electronic components of the first multi-chip module can be a first region of the retainer. The retainer can define a second region positioned opposite the second plurality of active electronic components of the second multi-chip module. The electronic device can further include a fourth thermal interface between the second region of the retainer and the second plurality of active electronic components of the second multi-chip module. And, the retainer can further be configured to urge the second plurality of active electronic components corresponding to the second multi-chip module and the opposed second region of the retainer toward each other.

The retainer can define a third region positioned between the first multi-chip module and the second multi-chip module. The third region can be conductively coupled with the cold plate.

The multi-chip module can be a first multi-chip module. The electronic device can further include a second multi-chip module conductively coupled with the cold plate.

The electronic device can also include third multi-chip module and a second cold plate thermally coupled with the third multi-chip module.

The electronic device can also include a distribution manifold and a collection manifold. The first cold plate and the second cold plate can define respective first ends fluidicly coupled with the distribution manifold and respective second ends fluidicly coupled with the collection manifold.

The electronic device can also include a pump and a heat exchanger configured to transfer heat from a liquid coolant to another medium. The pump can be configured to urge the liquid coolant through and among the distribution manifold, the first cold plate, the second cold plate, the collection manifold and the heat exchanger.

The thermal interface between the plurality of active components and the major surface of the cold plate can include a thermal interface material positioned between the external major surface of the cold plate and each in the plurality of active components.

The second thermal interface positioned between the second plurality of active electronic components and the opposed region of the retainer can include a thermal interface material. In such an embodiment, the thermal interface material is positioned between the second plurality of active electronic components and the opposed region of the retainer.

Similarly, the fourth thermal interface positioned between the second plurality of active electronic components on the second multi-chip module and the opposed region of the retainer can include a thermal interface material. In such an embodiment, the fourth thermal interface includes a thermal interface material positioned between the second plurality of active electronic components mounted to the second multi-chip module and the corresponding opposed region of the retainer.

In some embodiments, the thermal interface material corresponding to the second thermal interface and the thermal interface material corresponding to the fourth thermal interface are continuous with each other. In other embodiments, the thermal interface material corresponding to the second thermal interface and the thermal interface material corresponding to the fourth thermal interface are discontinuous from each other.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

FIG. 9 schematically illustrates an isometric view of another embodiment of one row of corrugated fins of the type shown in FIG. 5.

FIG. 10 schematically illustrates an isometric view of another embodiment of one row of corrugated fins of the type shown in FIG. 5.

FIG. 11 illustrates an alternative embodiment of an array of corrugated fins of the type shown in FIG. 5.

DETAILED DESCRIPTION

The following describes various principles related to liquid-cooling devices, and systems, suitable for cooling multi-chip modules. For example, certain aspects of disclosed principles pertain to liquid-cooled cold plates that can be placed in thermal contact with a plurality of DRAM components, and associated cooling systems. That said, descriptions herein of specific apparatus configurations and combinations of method acts are but particular examples of contemplated systems chosen as being convenient illustrative examples of disclosed principles. One or more of the disclosed principles can be incorporated in various other systems to achieve any of a variety of corresponding system characteristics.

Thus, systems having attributes that are different from those specific examples discussed herein can embody one or more presently disclosed principles, and can be used in applications not described herein in detail. Accordingly, such alternative embodiments also fall within the scope of this disclosure.

I. Overview

As noted above with respect to FIG. 1, the heat exchanger 110 removes heat from a component that dissipates heat while operating. However, the heat exchanger 110 need not be limited to cooling a single electronic component that dissipates heat while operating. For example, some electronic devices, e.g., servers (alone or installed in a rack, which itself may be installed in a data center), desktop computers, power electronics devices, etc., include a multi-chip module. And, some electronic devices include more than one such multi-chip module. Further, some multi-chip modules require rates of cooling beyond that which air cooling alone can achieve within some electronic devices. Accordingly, some electronic devices require augmented cooling for some or all components mounted to, for example, a multi-chip module.

Figure 1:
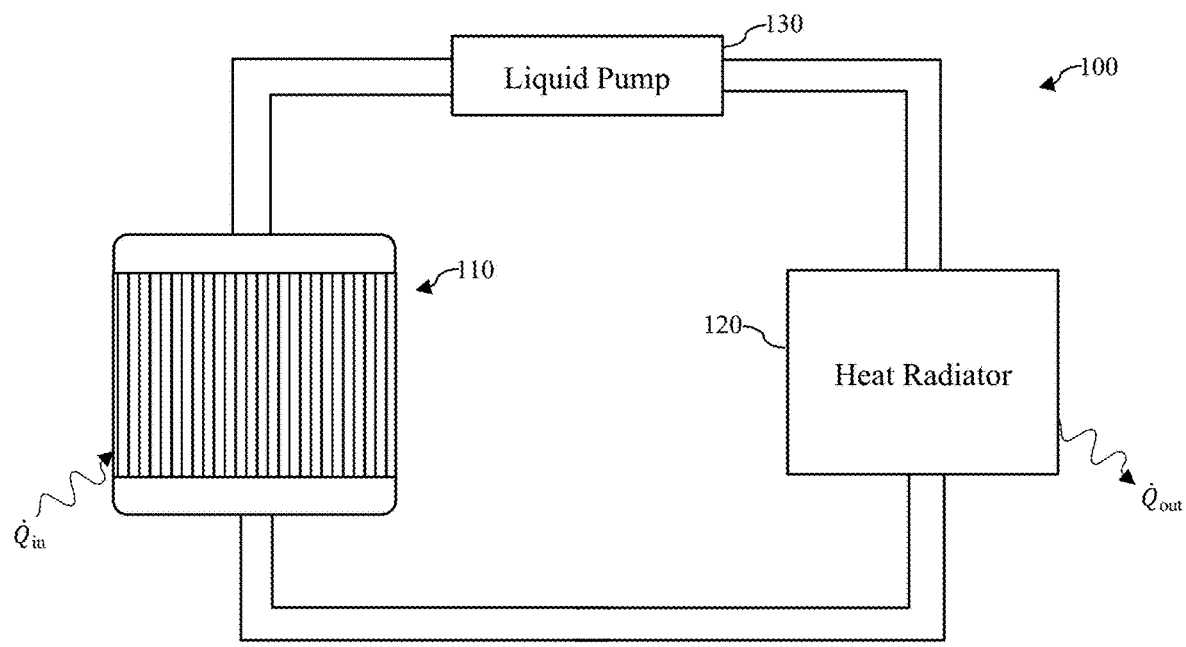
FIG. 1 illustrates a closed liquid-cooling loop.

Accordingly, the heat exchanger 110 shown in FIG. 1 can be configured to cool the heat-dissipating components of one or more multi-chip modules. For example, the heat exchanger 110 can conductively receive heat from the components and transfer it to a liquid coolant passing through the heat exchanger. As described above in connection with FIG. 1, the liquid coolant can flow from the heat exchanger 110 to a heat radiator 120, carrying the received heat to the radiator. As the heated coolant flows through the heat radiator, heat can be transferred to another cooling medium, cooling the liquid coolant. The cooled liquid coolant can again pass through the heat exchanger 110 to remove further heat dissipated by the heat-dissipating components of the one or more multi-chip modules. Additionally, one or more pumps 130 can urge the liquid coolant throughout the components of the cooling loop 100.

Further details of disclosed principles are set forth below. Section II describes principles pertaining to liquid-cooled cold plates configured to conductively receive heat dissipated by one or more components of a multi-chip module and to transfer the heat to a coolant passing through the cold plate. Section III describes principles pertaining to fin assemblies, and more particularly but not exclusively, to corrugated fin assemblies, configured to augment heat transfer between a cold plate and a liquid coolant flowing through the cold plate. Section VI describes principles related to heat-exchanger assemblies that incorporate one or more liquid-cooled cold plates, and Section V describes aspects of cooling systems incorporating such heat-exchanger assemblies. Section VI describes aspects of electronic devices incorporating such a cooling system and Section VII describes other embodiments of disclosed principles. Other related principles, e.g., manufacturing methods and assembly techniques, also are described.

II. Liquid-Cooled Cold Plates

Figure 2:
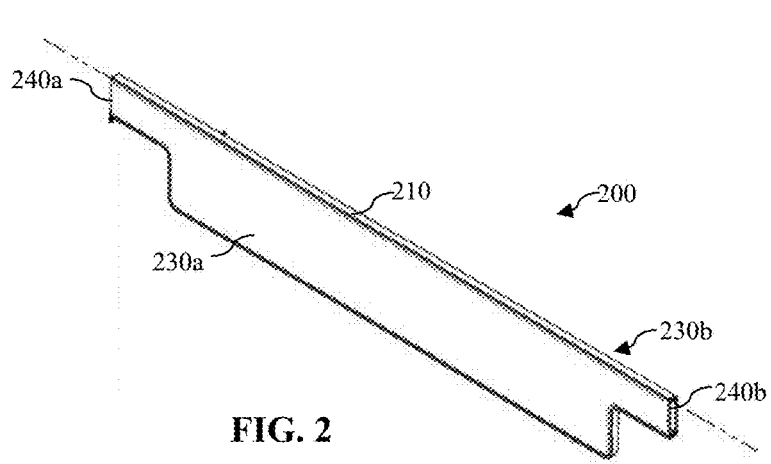
FIG. 2 illustrates an isometric view of a liquid-cooling device suited for cooling a multi-chip module.
Figure 3:
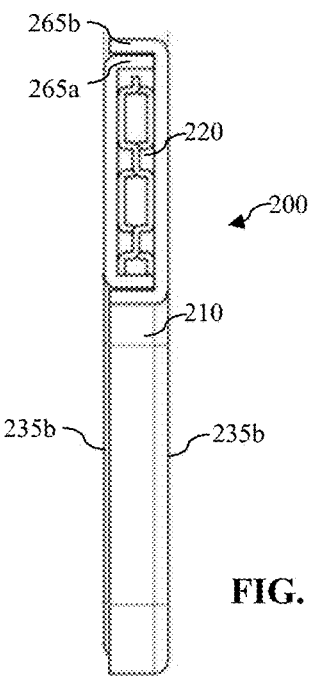
FIG. 3 illustrates an end-elevation view of the liquid-cooling device shown in FIG. 2.
Figure 4:
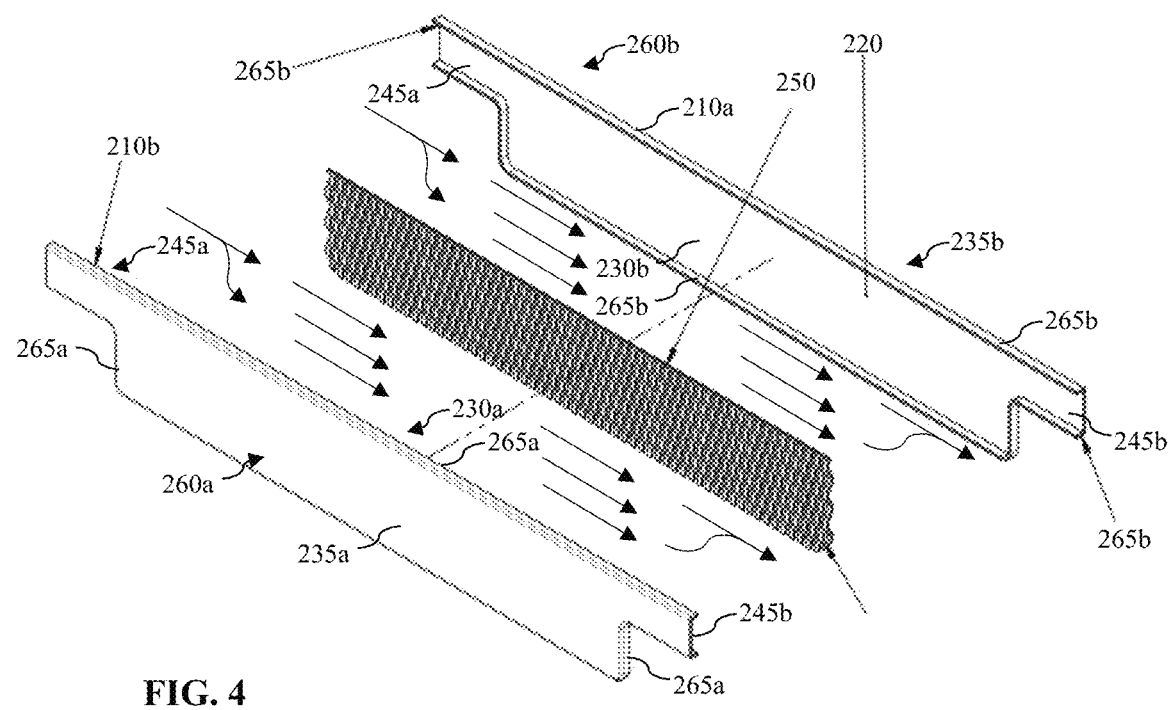
FIG. 4 illustrates an exploded view of the liquid-cooling device shown in FIG. 2.

Referring now to FIGS. 2, 3 and 4, aspects of a liquid-cooled cold plate are described. The cold plate 200 includes an enclosure 210 defining an internal chamber 220. The enclosure 210 has a wall 230a, 230b defining a corresponding external major surface 235a, 235b of the enclosure 210. The enclosure 210 extends from a first open end 240a to an opposed second open end 240b, allowing liquid coolant to enter through the open end 240a of the cold plate, pass through the internal chamber 220, and to exhaust through the opposed open end 240b of the cold plate. As the liquid coolant passes through the cold plate (e.g., as indicated by the arrows in FIG. 4), heat transfers from relatively warmer regions of the cold plate, e.g., from the wall 230a, 230b, to the relatively cooler liquid coolant within the internal chamber 220.

In the embodiment depicted in FIGS. 2, 3 and 4, an inlet passage 245a extends from the first open end 240a to the internal chamber 220 and an outlet passage 245b extends from the internal chamber 220 to the second open end 240b. As well, the illustrated embodiment includes a plurality of corrugated fins 250 positioned in the internal chamber 220 and conductively coupled with the walls 230a, 230b that define the respective external major surfaces 235a, 235b. The fins 250 increase a surface area exposed to the liquid coolant, increasing the efficiency of heat transfer from the cold plate 200 to the coolant, e.g., from the external major surfaces 235a, 235b, through the respective walls 230a, 230b and into the coolant passing through the internal chamber 220.

Some embodiments omit the fins. For example, convective heat transfer from the walls 230a, 230b to the liquid coolant passing through the internal chamber 220 can suffice to maintain a case temperature (or other specified device temperature) below an upper threshold. However, fins may be desirable to increase device cooling (and thus to reduce the device temperature) in certain system applications.

The plurality of corrugated fins 250 can urge against each wall 230a, 230b, which conductively couples the fins with the respective wall. Alternatively, the plurality of corrugated fins 250 (or a subset of them) can be conductively affixed to one or both walls 230a, 230b, as by soldering, brazing, or otherwise fusing them with the wall(s). As yet another alternative, the plurality of corrugated fins 250 (or a subset of them) can be conductively affixed to one or both of the walls 230a, 230b with an adhesive, e.g., a thermally conductive epoxy.

As shown in the exploded view of FIG. 4, the enclosure can be constructed from a first shell member 260a and a second shell member 260b sealably affixed to each other. For example, the first shell member 260a can define the wall 230a having an external major surface 235a and a corresponding outer periphery. A peripheral flange 265a can be oriented transversely relative to the external major surface 235a and positioned adjacent the outer periphery of the external major surface, as shown in FIG. 4. The peripheral flange 265a can be sealably affixed with the second shell member 260b, as by brazing, soldering, welding, or other fusing technique, or the peripheral flange and the second shell member can be adhesively secured with each other, as by applying an adhesive material in a joint between the peripheral flange and the second shell member.

However, as shown in the end-elevation view in FIG. 3 and the exploded view in FIG. 4, the second shell member 260b can define a region that is complementarily configured relative to the peripheral flange 265a (or another feature) defined by the first shell member 260a, allowing the first shell member 260a and the second shell member 260b to be sealably affixed with each other. For example, the second shell member 260b shown in FIGS. 3 and 4 defines an outer periphery and a corresponding peripheral flange 265b extending around the outer periphery of the second shell member. The peripheral flange 265b extending around the outer periphery of the second shell member can be sealably affixed with the peripheral flange 265a of the first shell member 260a, as shown for example in FIG. 3. More specifically, the peripheral flanges 265a, 265b can form a lap joint. The lap joint can be brazed, or otherwise fused, or adhered, sealably affixing the peripheral flanges, and thus the first and second shell members 260a, 260b together.

The first shell member, the second shell member, or both, may be constructed from a thermally conductive material, such as, for example, an alloy of copper, an alloy of aluminum, a thermally-conductive polymer or a thermally-conductive composite material. In some embodiments, each shell member 260a, 260b is stamped from a substantially planar sheet of material, e.g., copper. For example, the recess 221b in the second shell member 260b defined by the peripheral flange 265b and the second wall 230b can be formed by die-stamping a sheet of material. The recess 221b partially defines the internal chamber 220 of the cold plate 200. Although not shown, the first shell member 260a can also define a similar recess within the peripheral flange 265a and the first wall 230a, and thus also define a complementary portion of the internal chamber 220.

The plurality of corrugated fins 250 can be positioned between the first wall 230a and the second wall 230b, as shown in the exploded view in FIG. 4. Further, the plurality of corrugated fins 250 can be conductively coupled with the second wall 230b. Further, the second wall 230b can define a corresponding second external major surface 235b, permitting the cold plate 220 to conductively receive heat from a second multi-chip module through the second wall, as generally shown in FIGS. 9, 10 and 11 and described more fully below.

III. Corrugated Fins

Figure 5:
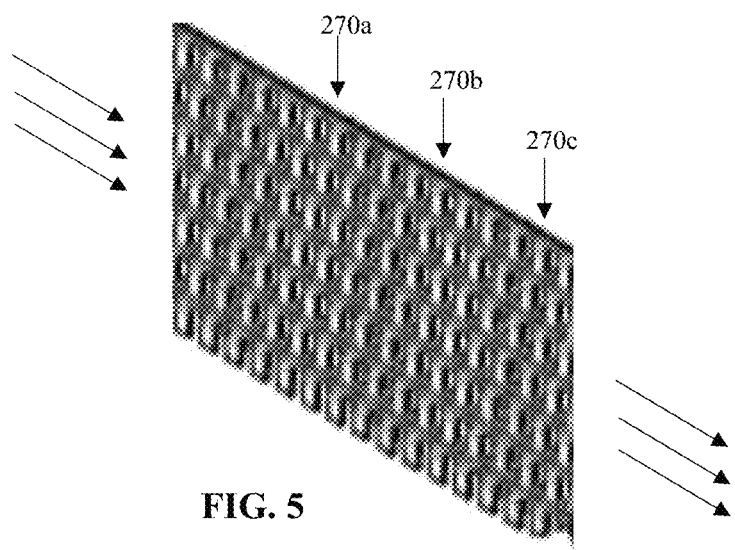
FIG. 5 illustrates an isometric view of an array of corrugated fins.

As shown in FIGS. 4 and 5, the plurality of corrugated fins 250 can be arranged in a plurality of rows of corrugated fins, e.g., rows 270a, 270b, 270c. The rows of fins can be oriented transversely to a direction of bulk fluid flow (indicated by arrows) through the cold plate. FIGS. 6 through 11 illustrate different embodiments of corrugated fins.

Each row of corrugated fins can be defined by an undulating and continuous sheet of material. For example, a continuous sheet of ductile material (e.g., copper or aluminum) can be die stamped or otherwise processed using a forming technique, a cutting technique, or both, to introduce corrugations extending out-of-plane of the sheet material.

Figure 6:
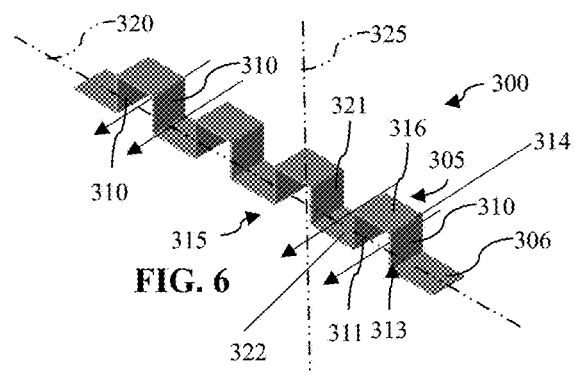
FIG. 6 schematically illustrates an isometric view of one row of corrugated fins of the type shown in FIG. 5.

For example, FIGS. 6, 9 and 10 schematically illustrate different arrangements of undulating and continuous sheets defining a single row of corrugated fins. As those drawings indicate, a single row of fins can constitute a distinct and independent member. Alternatively, a single row of fins, as in each of FIGS. 6, 9 and 10, can constitute a corresponding segment of a continuous member that defines an array of corrugated fins, as in FIGS. 5, 8, and 11.

With each of those arrangements, as shown in FIG. 6, for example, each row 300 of fins 310 can be installed in a cold plate 200 (FIG. 2) alone or in combination with one or more other rows of corrugated fins. Regardless of the specific arrangement of the fin-array 250 within a cold plate 200, each row of corrugated fins defines a corresponding longitudinal axis 320 along which the undulations 305 defining the corrugated fins 310 extend. In FIG. 6, for example, the longitudinal axis 320 extends transverse to a flow direction (indicated by the arrows) through the channels 315 defined by the corrugations. Further, each corrugated fin structure among FIGS. 6, 9 and 10 defines a corresponding corrugation axis (e.g., axis 325 in FIG. 6), and each corrugation axis is oriented transversely to the corresponding longitudinal axis (e.g., axis 320 in FIG. 6) of the row of fins (and transverse relative to a flow direction through the channels defined by the fins).

Figure 7:
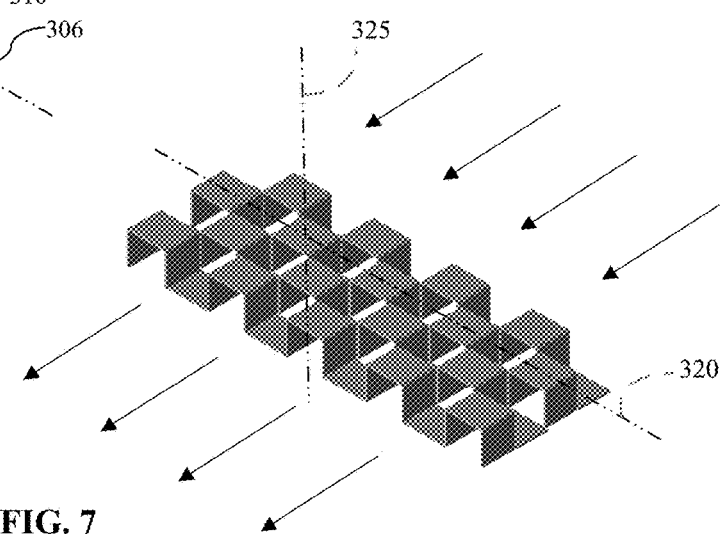
FIG. 7 schematically illustrates an isometric view of a plurality of rows of corrugated fins of the type shown in FIG. 5.

Within an array of corrugated fins, whether the array has a single row of fins (as in FIGS. 6, 9, and 10) or a plurality of rows of fins (as in FIGS. 7, 8, and 11) orienting the longitudinal axis of each row parallel to the longitudinal axis of at least one other row, all corrugation axes (and thus all fins) can extend in a single direction from a reference plane, as in FIGS. 6 and 7. Alternatively, a first group of corrugation axes (and thus a first plurality of fins) can extend in one direction from a reference plane and a second group of corrugation axes (and thus a second plurality of fins) can extend in a second direction, e.g., a direction opposite the first direction.

Figure 8:
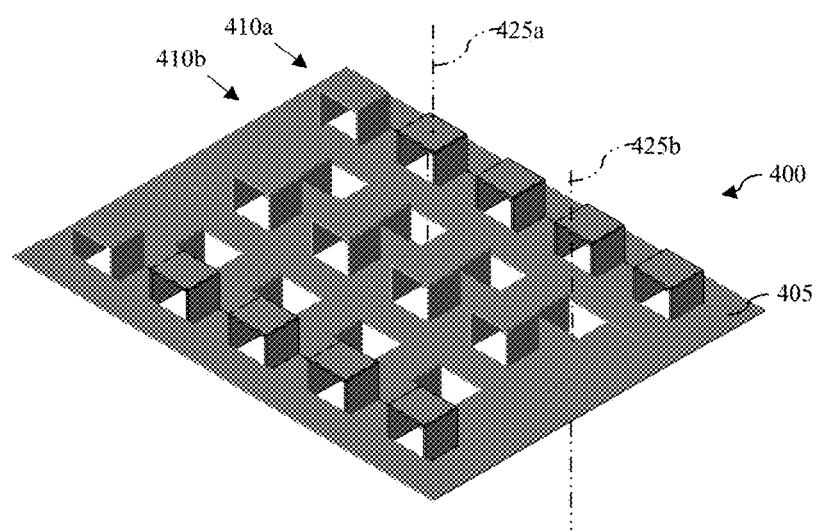
FIG. 8 illustrates an alternative embodiment of an array of corrugated fins of the type shown in FIG. 5.

Referring now to the corrugated fins 400 shown in FIG. 8, for example, the corrugation axis 425a in a first row 410a extends in a first direction (up) away from a reference plane, e.g., the mid-plane sheet 405. Similarly, the corrugation axis 425b of each fin in a second row 410b of fins extends in a second direction (down) away from the mid-plane sheet 405. As also shown in FIG. 8, each corrugation axis 425a in a selected row 410a of corrugated fins is longitudinally offset relative to each corrugation axis 425b of an adjacent row 410b of corrugated fins.

Alternatively, as FIGS. 9 and 10 depict, the corrugation axes (FIG. 9: 525a, 525b, 525c; FIG. 10: 625a, 625b, 625c) of a first group of fins within a given row (FIG. 9: 510; FIG. 10: 600) of fins can extend in a first direction (FIG. 9: up; FIG. 10: down) and the corrugation axes (FIG. 9: 526a, 526b, 526c; FIG. 10: 626a, 626bc) of a second group of fins within the row can extend in a second, e.g., opposite direction (FIG. 9: down; FIG. 10: up). The first group of fins can be interleaved (or juxtaposed) with the second group of fins within a given row 500, 600, as shown for example in FIGS. 9 and 10. Further, an array of fins positioned within the cold plate 200 (FIGS. 2, 3 and 4) can combine rows of fins as in either or both of FIGS. 9 and 10. For example, FIG. 11 shows alternating rows 510a, 610a, 510b, 610b, 510c of fins from FIGS. 9 and 10, respectively.

Thus, regardless of whether all fins in a single row of fins extend in a common direction (as in FIGS. 6 and 8), or a first group of fins in a given row of fins extends in one direction and a second group of fins in the row extends in an opposite direction (as in FIGS. 9, 10 and 11), an array of corrugated fins can have a first plurality of fins having their corrugation axes extending in a first direction from a mid-plane and a second plurality of fins having their corrugation axes extending in a second, or opposite, direction from the mid-plane. Stated differently, an array of corrugated fins can have a first group of fins that extend from one side (e.g., a major surface) of a sheet-like member and a second group of fins that extend from another side (e.g., an opposed major surface) of the sheet-like member, as depicted by way of example in FIGS. 8 and 11.

Referring still to FIGS. 6 through 11, a corrugated fin structure is described in detail. For example, in FIG. 6, an undulation 305 extends from a reference plane 306 in a direction along a corrugation axis 325 of the undulation. Each undulation 305 defines a pair of fins 310, 311 that extend transversely from the reference plane 306, with each extending from a proximal fin region 313 to a distal fin region 314. In FIGS. 6, 7 and 8, the distal fin regions 314 of each fin pair 310, 311 are joined together by a cap segment 316 that generally lies in a plane parallel to the reference plane 306.

Similarly, in FIG. 9, a first undulation 505 extends in one direction from a reference plane 506 in a direction along a corrugation axis 525a of the undulation, and a second undulation 515 extends in a second, opposite direction from the reference plane along the second corrugation axis 526a. As in FIG. 6, each undulation 505, 515 defines a corresponding pair of fins (e.g., undulation 505 defines fins 510, 511) that extend transversely from the reference plane 506, with each fin extending from a respective proximal fin region 513 to a corresponding distal fin region 514. As with the embodiment in FIG. 6, the distal fin regions 514 of each fin pair in FIGS. 9, 10 and 11, are joined together by a fin segment 516 (or cap) that generally lies in a plane parallel to the reference plane 506 (e.g., parallel to the longitudinal axis of the respective row of fins), closing off the flow channel between the fins 511, 513 of the respective fin pair. In other embodiments, however, the distal fin regions of a given fin pair can be directly joined with each other, or are joined together by a cap segment defining a convex or concave surface.

In FIGS. 6 through 11, the proximal fin region 513 of each fin in a pair of fins (except the outer-most fins in each row) connects with a proximal fin region of another fin in an adjacent pair of fins within the same row by a segment of the sheet material lying generally within the reference plane 506. In FIG. 6, for example, the proximal fin region 313 of the fin 311 is joined with the proximal fin region of the adjacent fin 321 by the segment 322 lying within the reference plane 306. Similarly, in FIG. 8, the proximal fin region 513 of the fin 511 is joined with the proximal fin region of the adjacent fin 521 by the segment of the sheet material lying within the reference plane 506. Similarly, as FIGS. 9, 10 and 11 show, the proximal fin region of each fin (except the first and the last fins, e.g., the outer-most fins) in a given row of fins is joined with the proximal fin region of an adjacent fin by a segment of the sheet material lying within the reference plane.

Any of the corrugated fin structures described above and illustrated by way of example in FIGS. 6 through 11 can be stamped or otherwise constructed from a sheet of material (e.g., a thermally conductive and ductile material, such as, for example, copper) using a forming technique. Further these structures can thermally couple with a cold plate wall, e.g., one or both of the walls 230a, 230b (FIG. 4). For example, each cap segment 316, 516 can urge against a wall 230a, 230b that defines a corresponding external major surface of the enclosure 210. In some embodiments, each cap segment is conductively affixed to the wall of the enclosure, as by brazing, soldering, or otherwise fusing the cap with the wall, or applying an adhesive (e.g., a thermally conductive adhesive) to the interface between the cap and the wall.

Although specific embodiments of fins are described above, those of ordinary skill in the art following a review of this detailed description will appreciate the wide variety of corrugated and non-corrugated fins that can be incorporated in a liquid-cooling device for a multi-chip module, e.g., the enclosure 210. For example, an alternative fin arrangement includes plate fins that are brazed or soldered, or otherwise thermally coupled with the interior surface of the walls 230a, 230b. Such plate fins can be assembled from a plurality of individual plates or sheets of a thermally conductive substrate (e.g., a sheet of copper or aluminum) or they can be stamped or otherwise formed from a continuous sheet or plate of a thermally conductive substrate.

IV. Heat Exchanger Assemblies

Figure 12:
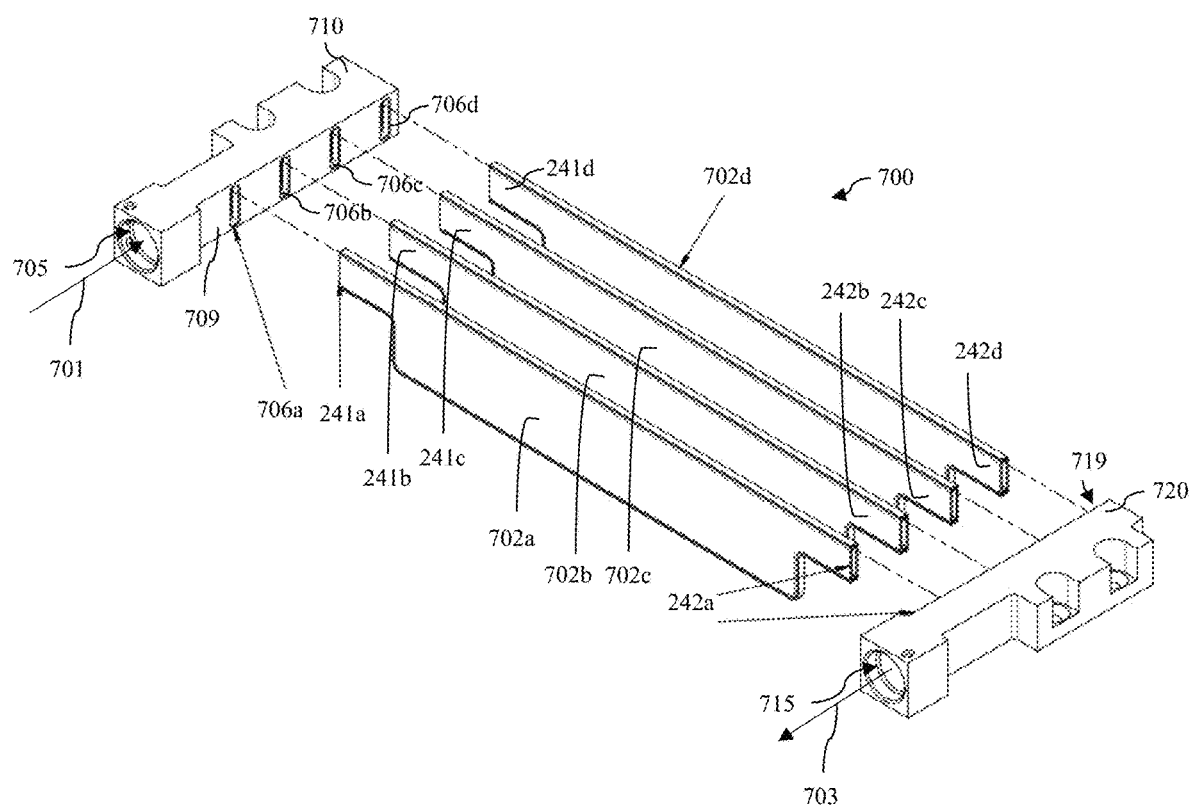
FIG. 12 illustrates an exploded view of a heat-exchanger assembly that incorporates a plurality of liquid-cooling devices as shown in FIG. 2.

A heat exchanger assembly can incorporate one or more cold plates 200 of the type described above. For example, FIG. 12 shows a heat exchanger 700 having a fluid inlet device 710 configured to receive cool coolant from a cooling loop (e.g., a loop 100 as in FIG. 1) and to convey the coolant to an inlet 245a to a cold plate as described above. Similarly, FIG. 12 shows a fluid outlet device 720 configured to receive heated coolant from the cold plate 200 and to return, or exhaust, the heated coolant to the cooling loop. In the particular heat-exchanger assembly 700 shown in FIG. 12, the fluid inlet device 710 is configured as a distribution manifold configured to distribute cool coolant from a cooling loop among four cold plates 702a, 702b, 702c, 702d of the type described above. And, in FIG. 12, the fluid outlet device 720 is configured as a collection manifold configured to collect heated coolant from the four cold plates four cold 702a, 702b, 702c, 702d before returning the heated coolant to the cooling loop.

As indicated by the arrow 701 in FIG. 12, cool coolant enters an inlet region 705 of the inlet manifold from the coolant loop. The inlet manifold conveys the cool coolant to each outlet 706a-d. In the embodiment in FIG. 12, each outlet 706a-d is configured as a recessed slot configured to receive a complementarily configured end region 241a-d of each respective cold plate 702a-d. With such an arrangement, the end region 241a-d of each cold plate 702a-d can be inserted into a corresponding slot 706a-d, fluidicly coupling the inlet region 245a (FIG. 2) of each cold plate 702a-d with the inlet region 705 of the manifold. In some embodiments, the end regions 241a-d can be brazed, soldered, or otherwise fused with the body 709 of the manifold. In other embodiments, insertion of each end region 241a-d in the corresponding slot 706a-d can provide a fluid-tight seal with the body of the manifold, and in still other embodiments, each end region 241a-d can incorporate a gasket, o-ring, or other fitting configured to make a fluid-tight connection between the cold plate 702a-d and the manifold's body 709.

As indicated by the arrow 703 in FIG. 12, heated coolant exhausts from an outlet region 715 of the outlet manifold to the coolant loop. The outlet manifold collects heated coolant from each cold plate 702a-d at a corresponding inlet (not shown) and conveys the heated coolant to the outlet region 715. In the embodiment in FIG. 12, each inlet to the outlet manifold is configured as a recessed slot (similar to the slots 706a-d in the inlet manifold) configured to receive a complementarily configured end region 242a-d of each cold plate 702a-d. With such an arrangement, the end region 242a-d of each cold plate 702a-d can be inserted into a corresponding slot, fluidicly coupling the outlet region 245b (FIG. 2) of each cold plate 702a-d with the outlet region 715 of the manifold. In some embodiments, each end region 242a-d can be brazed, soldered, or otherwise fused with the body 719 of the outlet manifold. In other embodiments, insertion of the respective end region 242a-d in the slot of the outlet manifold can provide a fluid-tight seal with the body of the manifold, and in still other embodiments, each end region 242a-d can incorporate a gasket, o-ring, or other fitting configured to make a fluid-tight connection between the cold plates 702a-d and the outlet manifold's body.

Although the heat-exchanger assembly 700 shown in FIG. 12 has four cold plates 702a-d, other heat-exchanger embodiments have more or fewer cold plates. As described below, some heat-exchanger embodiments provide one cold plate for each pair of multi-chip modules to be cooled (as in FIGS. 13, 14 and 15).

V. Cooling Systems

Referring again to FIG. 1, a heat-exchanger assembly as just described in relation to FIG. 12 can be substituted for the heat exchanger 110 shown in the schematic illustration in FIG. 1. Alternatively, one or more heat-exchanger assemblies as described in relation to FIG. 12 can be added to a cooling loop of the type depicted in FIG. 1. For example, the heat exchanger 110 shown in FIG. 1 may be placed in thermal contact with a processing component, and one or more heat-exchanger assemblies as in FIG. 12 can be fluidicly coupled (in series or in parallel) with the heat exchanger 110. On reviewing this disclosure, a person of ordinary skill in the art will understand and appreciate the various modifications to fluid connections, pumping resources and radiator configurations that such alternative arrangements could or would require in order to urge a sufficient flow of coolant through each heat exchanger/heat-exchanger assembly in a given cooling loop, as well as to reject absorbed heat from the coolant to another cooling medium.

VI. Electronic Devices

Figure 13:
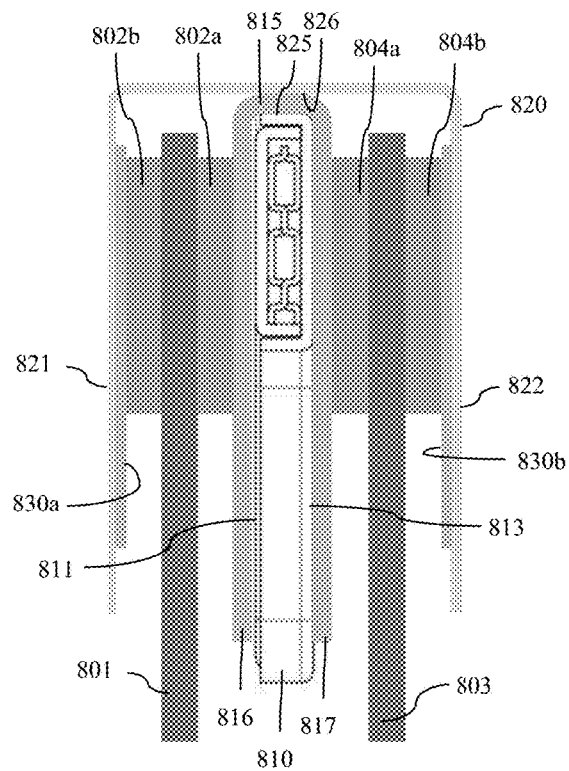
FIG. 13 schematically illustrates an end-elevation view of a liquid-cooling device as in FIG. 2 positioned between, and placed in thermal contact with, a pair of multi-chip modules.

A cooling system as just described can be installed in or on an electronic device to cool a multi-chip module. For example, as shown in the end-elevation view in FIG. 13, each multi-chip module 801, 803 can have mounted thereto a plurality of active electronic components 802a, b and 804a, b, respectively. Each active electronic component dissipates heat while operating. Because FIG. 13 is an end view, only two active electronic components 802a, b and 804a, b are visible on each module 801, 803, with each component being mounted on its own side of the respective multi-chip module. However, a typical memory module, for example, may have between four and forty, or more, active electronic components (e.g., DRAMs), as well as additional heat-dissipating components like power delivery devices, memory controllers, etc. Moreover, a given electronic device may have an array of multi-chip modules installed, with each module being cooled by a cooling system as described above. For example, such an array of multi-chip modules may include one or more multi-chip modules, or one or more pairs of multi-chip modules.

For purposes of illustration, a pair of multi-chip modules 801, 803 cooled by a single cold plate 810 is shown in FIG. 13. The cold plate 810 is positioned between the multi-chip modules 801, 803 and is configured as described above. Each external major surface 811, 813 of the cold plate is positioned opposite a corresponding plurality of active components 802a, 804a, respectively. A thermal interface material 815 is positioned between each respective external major surface 811, 813 and each in the corresponding plurality of active components 802a, 804a, respectively. For example, a commercially available, thermally conductive, gap-filling pad can be positioned between the cold plate 810 and the adjacent set of active components 802a, 804a to provide a thermal-conduction path from the active components to the cold-plate enclosure, while also allowing for variation in gap width between the cold plate and each active component. Such gap variation can be due to variability in component height that arises during manufacturing and assembly of the multi-chip module, variations in the orientation of the multi-chip module, as well as dimensional variations in the heat-exchanger assembly that arise during manufacturing or installation. In FIG. 13, such a gap-filling pad is draped over the cold plate 810, forming a U-shaped "blanket" partially covering the cold plate and placing the bars 816, 817 of the U-shape between the cold plate and the inner rows 802a, 804a of active components.

A retainer 820 can urge the external major surface of the cold plate 810 and the plurality of active components 802a, 804a of each multi-chip module 801, 803 toward each other. As shown in FIG. 13, the retainer 820 can be a U-shaped retainer oriented upside down, allowing the bars 821, 822 of the U-shape to extend downward and overlie the multi-chip modules 801, 803 and their components 802b, 804b outwardly of the modules relative to the cold plate 810. With such an arrangement, the bars 821, 822 can be thermally coupled with the outer active components 802b, 804b, providing a conductive heat-transfer path through the retainer 820 from the outer components 802b, 804b to the cold plate 810, and more particularly to the peripheral region 825 of the cold plate in thermal contact with the retainer through the thermal-interface material 815. The peripheral region 825 of the cold plate can be configured with an intended heat-transfer surface, such as, for example, a relatively flat surface suitable for making thermal contact with a corresponding flat surface 826 of the retainer 820 positioned opposite the flat surface of the peripheral region 825. The intended heat-transfer surface of the peripheral region 825 can conductively receive heat absorbed by the retainer 820 from the outer components 802b, 804b. The heat-transfer path through the retainer 820 to the cold plate 810 is thermally in parallel with a conductive heat-transfer path through the substate and inner components 802a, 804a of the multi-chip module. Accordingly, in addition to urging the cold plate and multi-chip modules into thermal contact with each other, the retainer 820 provides additional cooling by providing another efficient heat-transfer path from the components 802b, 804b on the multi-chip modules 801, 803 to the cold plate 810.

As with the interface between the cold-plate and the inner rows of active components 802a, 804a, a thermal-interface material, e.g., a thermally conductive, gap-filling pad, can be positioned between each retainer bar 821, 822 and a corresponding adjacent row of active components 802b, 804b mounted to the multi-chip modules. In some embodiments, the thermal interface material 830a, 830b provided between the arms 821, 822 of the retainer 820 and the outer rows of active components 802b, 804b has electrically insulating properties, as to inhibit short-circuiting of electronic components should a region of the retainer, covered by the thermal interface material, come into contact with one or more electrical conductors on one of the multi-chip modules.

In FIG. 13, a strip 830a of thermal interface material covers a region of one arm 821 of the retainer 820 and another strip 830b of thermal interface material covers a region of the opposed arm 822 of the retainer. The strips 830a, 830b of thermal interface material can enhance thermal coupling between the outer components 802b, 804b, respectively, and the corresponding retainer bars 821, 822. Consequently, the strips of thermal interface material can further enhance the heat transfer path from the components 802b, 804b to the cold plate 810 provided through the retainer 820. As shown in FIG. 13, the strips 830a, 830b can be discontinuous from each other.

Figure 14:
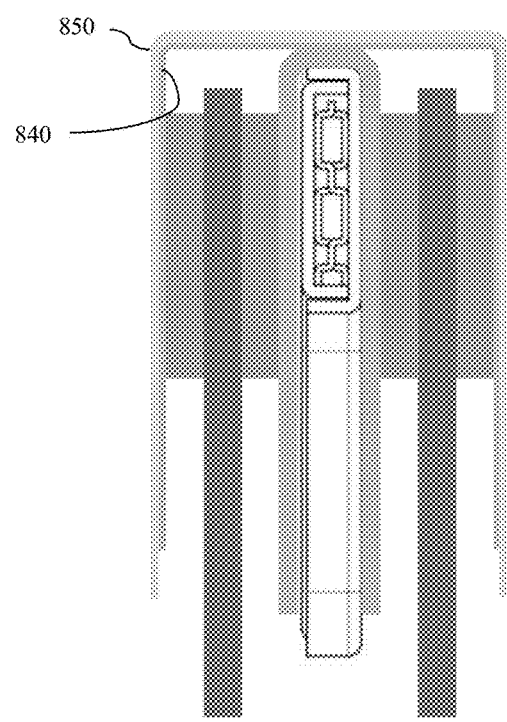
FIG. 14 schematically illustrates an end-elevation view of an alternative embodiment of a liquid-cooling device as in FIG. 9.

FIG. 14 shows an alternative embodiment of an electronic device having multi-chip modules cooled by a liquid-cooled cold plate assembly. The FIG. 14 embodiment is similar to that shown in FIG. 13 and described above, except a unitary strip of the electrically insulative, thermal-interface material 840 in FIG. 14 overlies a relatively larger region of the retainer 850, similar to the "blanket" arrangement of the thermal interface material 815 overlying the cold plate 810 in FIG. 13. Stated differently, the embodiment shown in FIG. 14 is similar to the embodiment depicted in FIG. 13, except the strips 830a, 830b in FIG. 13 are continuous with each other in FIG. 14. Compared to the arrangement shown in FIG. 13, the arrangement shown in FIG. 14 may improve the lifespan of the thermal interface and electrical insulation over multiple installation and removal cycles, as can be expected due to removal and replacement of the multi-chip modules 801, 802 over the service life of the electronic device in which they are installed.

Figure 15:
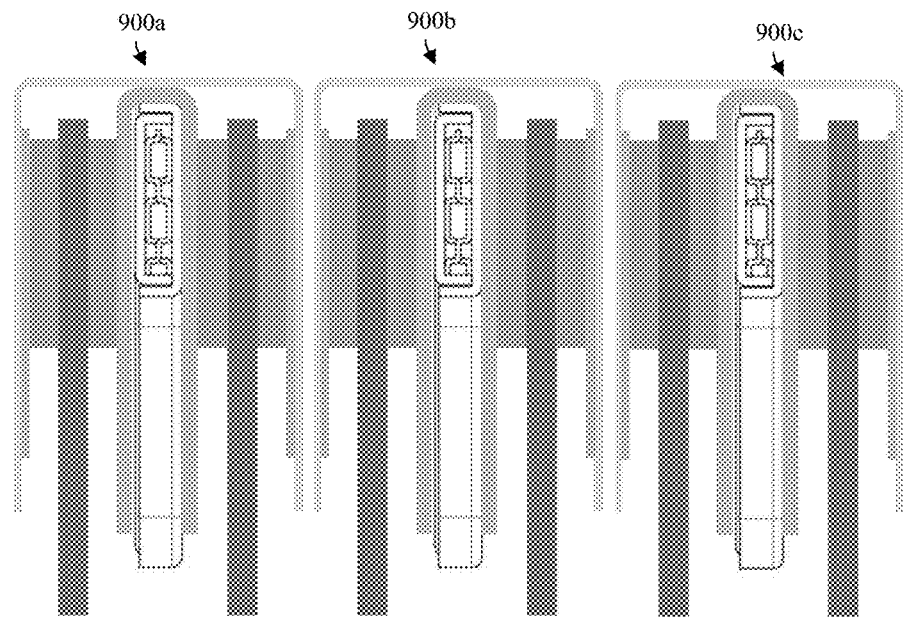
FIG. 15 schematically illustrates an end-elevation view of a plurality of liquid-cooling devices arranged relative to a corresponding plurality of pairs of multi-chip modules, as in FIG. 9.

FIG. 15 schematically illustrates a portion of an electronic device having an array 900a, 900b, 900c of six multi-chip modules cooled by three cold plates secured between the multi-chip modules by means of three corresponding retainers configured as just described in relation to FIGS. 13 and 14. In FIG. 15, the thermal interfaces between the outer components and the corresponding retainer bars are shown as being discontinuous from each other as in FIG. 13. Nonetheless, a continuous thermal interface material can be applied to those thermal interfaces as described above in relation to FIG. 14. The cold plates in FIG. 15 form a portion of a heat-exchanger assembly as described in relation to FIG. 12, which in turn is connected to a cooling loop as described above.

VII. Other Embodiments

The examples described above generally concern apparatus, methods, and related systems to cool one or more multi-chip modules, each having a plurality of active electronic components that dissipate heat while operating. Nonetheless, the previous description is provided to enable a person skilled in the art to make or use embodiments of the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of cooling devices for multi-chip modules, and related methods and systems to remove waste heat from such multi-chip modules. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of cooling devices, and related methods and systems that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We currently claim:

1. A liquid cooling system, comprising:
an enclosure defining an internal chamber and having a wall defining an external major surface of the enclosure, wherein the enclosure extends from a first open end to an opposed second open end, an inlet passage extends from the first open end to the internal chamber, and an outlet passage extends from the internal chamber to the second open end, and wherein the enclosure further defines an outer peripheral surface transversely oriented relative to the external major surface and extending from the first open end to the opposed second open end; and
a retainer having a first segment, a second segment and an intermediate segment extending from the first segment to the second segment, wherein a thermal coupling of the outer peripheral surface of the enclosure with the intermediate segment provides a direct conductive heat-transfer path, with or without a thermal-interface material, from the first segment, the second segment, or both, to the external major surface of the enclosure.

2. The liquid cooling system according to claim 1, wherein the enclosure comprises a first shell member and a second shell member sealably affixed to each other.

3. The liquid cooling system according to claim 2, wherein the first shell member defines the wall defining the external major surface and a corresponding outer periphery, the first shell member comprising a peripheral flange oriented transversely relative to the external major surface and positioned adjacent the outer periphery of the external major surface.

4. The liquid cooling system according to claim 3, the peripheral flange being sealably affixed with the second shell member.

5. The liquid cooling system according to claim 3, wherein the second shell member defines a corresponding outer periphery and a peripheral flange extending around the outer periphery of the second shell member, the peripheral flange extending around the outer periphery of the second shell member being sealably affixed with the peripheral flange of the first shell member.

6. The liquid cooling system according to claim 2, wherein the wall defining the external major surface is a first wall, the first shell member comprising the first wall, wherein the second shell member comprises a second wall, the cooling system further comprising a plurality of corrugated fins being positioned between the first wall and the second wall.

7. The liquid cooling system according to claim 6, the plurality of corrugated fins being further conductively coupled with the second wall.

8. The liquid cooling system according to claim 6, wherein the external major surface is a first external major surface, wherein the second wall defines a corresponding second external major surface.

9. The liquid cooling system according to claim 2, wherein each of the first shell member and the second shell member defines a corresponding peripheral flange, wherein a brazed joint sealably affixes the respective peripheral flanges together.

10. The liquid cooling system according to claim 6, wherein the plurality of corrugated fins urge against the first wall, conductively coupling the fins with the first wall.

11. The liquid cooling system according to claim 10, wherein the plurality of corrugated fins are conductively affixed to the first wall.

12. The liquid cooling system according to claim 11, wherein the plurality of corrugated fins are soldered or brazed to the first wall, conductively affixing the fins to the first wall.

13. The liquid cooling system according to claim 6, wherein the plurality of corrugated fins is arranged in a plurality of rows of corrugated fins, each row of corrugated fins defined by an undulating and continuous sheet of material.

14. The liquid cooling system according to claim 13, each row of corrugated fins defining a corresponding longitudinal axis along which each respective row of corrugated fins extends, wherein each corrugated fin defines a corresponding corrugation axis, wherein each corrugation axis of each corrugated fin in each respective row is oriented transversely to the longitudinal axis of the respective row.

15. The liquid cooling system according to claim 14, wherein, in at least one row of corrugated fins, each corrugation axis of a first plurality of fins extends in a first transverse direction relative to the corresponding longitudinal axis and each corrugation axis of a second plurality of fins extends in a second transverse direction relative to the corresponding longitudinal axis.

16. The liquid cooling system according to claim 15, wherein the first transverse direction and the second transverse direction are opposite each other.

17. The liquid cooling system according to claim 15, wherein the longitudinal axis of the at least one row of corrugated fins extends parallel to the longitudinal axis of at least one other row of corrugated fins.

18. The liquid cooling system according to claim 17, wherein the first transverse direction and the second transverse direction are opposite each other relative to a plane defined by the parallel longitudinal axes.

19. The liquid cooling system according to claim 18, wherein the first plurality of fins and the second plurality of fins are juxtaposed with each other.

20. The liquid cooling system according to claim 19, wherein a corresponding segment of the continuous sheet of material extends from each corrugated fin in the first plurality of fins to an adjacent corrugated fin in the second plurality of fins.

21. The liquid cooling system according to claim 14, wherein each corrugation axis corresponding to a first row of corrugated fins is longitudinally offset relative to each corrugation axis corresponding to a second row of corrugated fins.

22. The liquid cooling system according to claim 21, wherein each corrugation axis corresponding to the first row extends in a first transverse direction and wherein each corrugation axis corresponding to the second row extends in a second transverse direction.

23. The liquid cooling system according to claim 22, wherein the first transverse direction is opposite the second transverse direction.

24. The liquid cooling system according to claim 13, wherein a segment of the continuous sheet of material extends from each row of corrugated fins to an adjacent row of corrugated fins.

25. The liquid cooling system according to claim 13, wherein each corrugated fin in a plurality of fins in at least one of the rows of fins defines a fin segment oriented substantially parallel to the corresponding longitudinal axis.

26. The liquid cooling system according to claim 25, wherein each fin segment urges against the first wall defining the external major surface of the enclosure.

27. The liquid cooling system according to claim 25, wherein each fin segment is conductively affixed to the wall defining the external major surface of the enclosure.

28. The liquid cooling system according to claim 1, wherein a region of the peripheral surface is substantially flat and thermally couples with a surface defined by the retainer.

29. The liquid cooling system according to claim 1, wherein the direct conductive heat-transfer path from the first segment, the second segment, or both, to the external major surface of the enclosure extends through the intermediate segment of the retainer.

30. A liquid cooling system, comprising:
an inlet manifold and an outlet manifold; and
a cold plate comprising an enclosure defining a first external major surface, an opposed second external major surface, and a corresponding internal chamber positioned between the first external major surface and the second external major surface, wherein the internal chamber is fluidically coupled with the inlet manifold and the outlet manifold, the cold plate further defining an external peripheral surface between the first external major surface and the opposed second external major surface; and
a U-shaped retainer having a first bar, a second bar, and an intermediate portion, each of the first bar and the second bar defining a corresponding major surface and the intermediate portion being configured to thermally couple with the external peripheral surface of the cold plate, defining a direct conductive heat-transfer path, with or without a thermal interface material, from the first bar, the second bar, or both, to the internal chamber of the cold plate.

31. The liquid cooling system according to claim 30, wherein the enclosure comprises a first shell member defining a corresponding periphery and the first external major surface and a second shell member defining a corresponding periphery and the second external major surface, wherein the periphery of the first shell member and the periphery of the second shell member are sealably joined together, defining the external peripheral surface.

32. The liquid cooling system according to claim 30, wherein the cold plate extends from a first open end fluidically coupled with the inlet manifold to an opposed second open end fluidically coupled with the outlet manifold.

33. The liquid cooling system according to claim 32, wherein the enclosure defines a fluid inlet passage extending from the first open end to the internal chamber and a fluid outlet passage extending from the internal chamber to the second open end.

34. The liquid cooling system according to claim 32, wherein the array of corrugated fins is positioned between the first open end of the cold plate and the second open end of the cold plate.

35. The liquid cooling system according to claim 30, wherein the cold plate is a first cold plate, the heat exchanger further comprising a second cold plate defining a corresponding internal chamber fluidically coupled with the inlet manifold and the outlet manifold.

36. The liquid cooling system according to claim 35, wherein the first cold plate is fluidically coupled with the inlet manifold and the outlet manifold in parallel with the second cold plate.

37. The liquid cooling system according to claim 30, wherein the direct conductive heat-transfer path from the first bar, the second bar, or both, to the internal chamber of the cold plate extends through the enclosure of the cold plate.

38. The liquid cooling system according to claim 37, wherein the direct conductive-heat transfer path further extends through the intermediate portion of the retainer.

39. A cooling system for an electronic device, the cooling system comprising:
a distribution manifold and a collection manifold;
a plurality of cold plates, each cold plate comprising an enclosure defining a first external major surface, an opposed second external major surface, an external peripheral surface, and a corresponding internal chamber positioned between the first external major surface and the second external major surface, wherein each respective internal chamber is fluidically coupled with the distribution manifold and the collection manifold and each first external major surface is configured to thermally couple with a corresponding heat-generating component;
a retainer configured to urge the first external major surface of at least one of the cold plates toward the corresponding heat-generating component, the retainer further defining a thermal interface with the enclosure of the respective one of the cold plates;
a heat exchanger configured to transfer heat from a liquid coolant passing through the heat exchanger to another medium; and
a pump configured to urge the liquid coolant through and among the distribution manifold, the plurality of cold plates, the collection manifold and the heat exchanger.

40. The cooling system according to claim 39, wherein each enclosure comprises a first shell member defining a corresponding periphery and the respective first external major surface, each enclosure further defining a second shell member defining a corresponding periphery and the respective second external major surface, wherein the periphery of each respective first shell member is sealably joined with the periphery of the corresponding second shell member, defining the external peripheral surface of the respective enclosure.

41. The cooling system according to claim 39, wherein each cold plate extends from a first open end fluidicly coupled with the distribution manifold to an opposed second open end fluidicly coupled with the collection manifold.

42. The cooling system according to claim 41, wherein each respective enclosure defines a fluid inlet passage extending from the corresponding first open end to the corresponding internal chamber and a fluid outlet passage extending from the corresponding internal chamber to the corresponding second open end.

43. The cooling system according to claim 39, wherein at least one of the cold plates further comprises an array of corrugated fins defined by a continuous sheet of material, the array of corrugated fins being positioned within the internal chamber and conductively coupled with the enclosure corresponding to the respective at least one of the cold plates.

44. The cooling system according to claim 43, wherein each array of corrugated fins is positioned between the first open end of the corresponding cold plate and the second open end of the corresponding cold plate.

45. The cooling system according to claim 39, wherein each cold plate is fluidicly coupled with the distribution manifold and the collection manifold in parallel with at least one other cold plate.

46. The cooling system according to claim 39, wherein the external peripheral surface of the at least one of the cold plates defines a flat peripheral surface extending from the periphery of one major surface to the periphery of the opposed major surface.

* * * * *